(12) United States Patent
Weinraub

(10) Patent No.: US 7,327,153 B2
(45) Date of Patent: Feb. 5, 2008

(54) ANALOG BUILT-IN SELF-TEST MODULE

(75) Inventor: Chananiel Weinraub, Herzliya (IL)

(73) Assignee: Texas Instruments Incorporated, Dallas, TX (US)

(*) Notice: Subject to any disclaimer, the term of this patent is extended or adjusted under 35 U.S.C. 154(b) by 79 days.

(21) Appl. No.: 11/265,352

(22) Filed: Nov. 2, 2005

(65) Prior Publication Data

US 2007/0096759 A1   May 3, 2007

(51) Int. Cl.
*G01R 31/02* (2006.01)
*G06F 11/00* (2006.01)
(52) U.S. Cl. .................... 324/763; 714/724
(58) Field of Classification Search ............. None
See application file for complete search history.

(56) References Cited

U.S. PATENT DOCUMENTS 6,642,736 B2 * 11/2003 Mori et al. ............... 324/765

* cited by examiner

*Primary Examiner*—Ha Tran Nguyen
*Assistant Examiner*—Trung Q. Nguyen
(74) *Attorney, Agent, or Firm*—Yingsheng Tung; Wade James Brady, III; Frederick J. Telecky, Jr.

(57) ABSTRACT

An analog BIST (Built-in Self-Test) module for a load board in a test system for testing Integrated Chips (IC) and other devices-under-test (DUTs). Components of the test module perform test setup, transmission of analog test signals to a DUT, capture of analog and digital test data from the DUT, and on-board analysis of the test data using DSPs without sending the test data to a tester. Modules may be add-on boards to load boards an contain one or more processors and multiple components to test DUTs in parallel, significantly decreasing test and analysis times of a test system such as a Very Low Cost Tester (VLCT).

16 Claims, 11 Drawing Sheets

118 DUT Open / Short Test
120 ADC Calibration
122 DAC / DDS Calibration
124 DUT Receiver Rx Test
126 DUT Transmitter Tx Test

ANALOG BUILT-IN SELF-TEST MODULE

CROSS-REFERENCE TO RELATED APPLICATIONS

None

FIELD OF THE INVENTION

This invention relates generally to automatic test equipment used to test integrated circuit elements, and more particularly to interface hardware used in automatic test equipment to connect devices under test to a test head in order to perform the testing.

BACKGROUND OF THE INVENTION

Automatic test equipment is generally used to test semiconductor devices and integrated circuit (IC) elements, such as memory or logic, for manufacturing defects. Manufacturers of automatic test equipment (ATE) offer test systems to address the increasingly complex task of testing advanced ICs. However, many commercially available ATE systems are complex, proprietary, not easily flexible to meet changing test conditions, and often require additional heat removal systems and typically cost several million dollars that make them unattractive for use in a cost driven manufacturing environment. Recently, many semiconductor manufacturers and some ATE suppliers have introduced low cost test systems such as the TI proprietary or other very low cost tester (VLCT). The VLCT system may be used as a standalone test system and/or used in combination with a conventional ATE system (this is called "Multi Path Testing"). The VLCT systems typically provide lower test costs and are more flexible in meeting the changing test conditions, making them more attractive in the cost driven manufacturing environment.

Testing devices during production generally requires an appropriate tester to test an IC chip. During production of an integrated processor, various tests may be performed. A test system allows a test assembly to interface with a chip using an interface apparatus.

A conventional programmable electronic circuit test system tests a "device under test" and commonly referred to as a "DUT." FIG. 1 illustrates a diagram of a conventional test system 10 for testing a DUT 12. The test system 10 includes a tester 14 that is operable to communicate test signals to the DUT through a test head 16 via one or more electrical couplers 18 such as conductors, cables, lines pins, links, traces, and/or busses. The tester 14 may have various electronic test and measurement instruments, such as AC and DC electrical signal generators for applying electrical signals through digital and/or analog channels to a DUT on the test head 16. Tester 14 is also has capabilities to receive and analyze data from tests performed on a DUT 12.

For every IC that is designed and manufactured, test hardware called a test interface board or "load board" 20 is built for production tests. FIG. 1 illustrates how a typical tester 14 interfaces to DUT 12 through load board 20 that is attached to the test head 16. The DUT 12 is mounted onto the load board 20 via a socket. Configurations of a load board can vary depending on the type, size, and quantity of DUTS being tested. A typical load board 20 is a printed circuit board (PCB) that may be up to about 5 mm thick.

Tester 14 communicates instructions and test programs to the test head 16, which applies analog test signals to DFT or other architecture of DUT 12 through load board 20 using connectors between the DUT 12 I/O (Input/Output) ports and load board 20. Load board 20 may comprise one or more RF connectors, where each connector is operable to communicate an RF test signal to DUT 12 and also may include high-speed test signals through hard-wired connections. DUT 12 receives analog test signals from the load board 20, processes the signals according to a test procedure, and transmits the processed test signals back to the load board 20, which transmits the test data through the test head 16 and back to the tester 14 for further analysis by tester 14.

To increase the mass production of a DUT 12, the test system 10 can be programmed to perform the tests on multiple DUTs on a load board 20 in parallel. In this way, multiple DUTs can be tested rapidly and simultaneously. To automatically load and unload DUT 12 to and from sockets on a load board 20, a robotic handling machine called a handler (not shown) can be included with a test system 10. The handler also sorts the failing DUTs from passing DUTs after a test is performed.

Many commercially available, advanced, multi-function test systems are often very complex, bulky, require additional heat removal systems and typically cost several million dollars. Some of the lower cost test systems may offer more flexibility and may be more affordable but may be limited by their performance and capacity. For example, some VLCT systems may have a limited data throughput for testing and may include a limited number of input/output (I/O) channels available for testing. Other limitations may include processing speed of the computers and test instruments and limited processing capacity (e.g., MIPS, DSP, Data transfer rate or memory) in a tester. Some of these limitations may result in increasing the time and therefore reducing the efficiency to test each IC device. The additional time needed for testing each device is magnified at the manufacturing process level when a up to millions of chips need to be tested. As a result, some of the limitations of the VLCT systems may inadvertently slow down the production rate and may contribute to an overall increase in the cost of testing.

Since VLCT systems have limitations on performance and capacity that may negatively impact the production rate for manufacturing a device, the alternative of purchase new VLCT systems for different types of devices can be cost prohibitive, as each new system costs hundreds of thousands of dollars. Further, if a new type of DUT is to be tested, or if multiple DUTs need to be tested to increase the production capacity, the old load board must be replaced with a new board compatible with the different DUT, which increases costs. There is a need for a low-cost, fast, and flexible solution for performing tests of new devices.

SUMMARY OF THE INVENTION

In the present invention, a tester connects to a test interface board, called a "load board, that is attached to a test head. One side of the load board has a socket that receives an integrated circuit chip for analog testing. The opposite side of the board contains all the electrical connections, circuitry, chips, and processors needed for performing the test on the chip. The improvement to this system comprises additional electronic circuitry that is designed into or attached to the load board that performs the tasks of a test formerly performed by a tester 14. The circuitry is organized on a board called an analog BIST (Built-in Self Test) module. On the test module, analog circuits are attached to the load board that perform most, or all, of the testing tasks. The analog tests can be performed by one or more test boards on a load board in parallel for one or multiple devices under test (DUTs), resulting in faster testing than a conventional tester.

If a tester can perform one analog test, one device at a time and each test takes one second, about 100 seconds are required for testing one hundred analog cells in a single DUT. But on the load board, with specific circuitry of a test module to test one hundred analog circuits in parallel, the entire test takes one second, significantly increasing efficiency of device testing and reducing costs. In production of an integrated circuits, millions of chips may be produced and tested. The savings of millions of seconds of test time provided by the present invention also reduces the costs an equivalent amount.

Conventional testers are very expensive and cannot be purchased often to keep up with the fastest computer technology. Most testers have built-in limitations of speed and performance to test devices. For example, if input bandwidth of the analog measurement unit on the tester is limited to 100 MHz, the test module of the present invention can be built to a specified input bandwidth of 500 MHz or 1 GHz. It is much easier and cost effective to replace a component of a load board in order to increase processing speed and capacity of a test system instead of either putting an expensive production run on hold or to buy a completely new test system.

The present invention describes a way of aiding the circuitry of a test system so that the test module will perform all the test setup, analog test data capture, Analog test signal generator, clock generation on the load board and perform data analysis with an on-board DSP instead of the tester. A tester can still perform test programming and analysis, however these traditional tasks are optional when using the test module of the present invention in a test system.

To increase flexibility of component specifications and testing capacity, the exemplary analog BIST module of the present invention is preferably an add-on component to a load board, however the load board itself could have the components and functionality of a test module built-into the board. Components of a test module include an FPGA (Field Programmable Gate Array). Test setup is performed by the FPGA. A DAC or DDS is used to drive any analog input of the DUT and an amplifier may be added in the stream with a digital attenuator to adjust the test signal amplitude. Test data inside the DUT that is converted to digital by an ADC (Analog-to-Digital Converter) is exported through an optional SERDES (serialize/deserialize) port. The FPGA captures the test data from the SERDES into memory or a buffer and drives the data to an on-board DSP for analysis. An ADC with a high input band-width samples or undersamples any analog output from the DUT prior to export in digital format to the FPGA. The processing and speed for analyzing the captured data may be adjusted by choosing the appropriate number of DSPs for the volume and type of tests being performed on multiple DUTS in a tester. Relays are also included in the test module to enable self-test of the BIST prior to starting device tests and to apply/measure Analog differential signals to/from the DUT.

The various embodiments of an analog BIST module enable extremely fast analog final test and analog characterization of a DUT on any tester, such as a VLCT. Test setup can be performed simpler and faster by DFT (Design for Test) techniques so that every test mode will set a value into all relevant registers inside the DUT without the need for programming by functional vectors. The module enables parallel, simultaneous tests of all analog ports or differential channels of the DUT. The jitter in the clock distribution on the module is reduced by using OCXO and LVPECL devices and level translators for every clock receiver. Data stimuli and capture is performed faster by using high-speed digital interfaces such as SERDES and LVDS, and ADC or DAC/DDS components with appropriate speed specifications. Data analysis is performed quicker by using one or more DSPs on the module without functional patterns for transferring the captured data to the tester. Various implementations of the analog BIST module in a test system include directly attached to a load board, connected to a load board through an appropriate data bus.

BRIEF DESCRIPTION OF THE DRAWINGS

For a better understanding of the nature of the present invention, its features and advantages, the subsequent detailed description is presented in connection with accompanying drawings in which.

DETAILED DESCRIPTION OF THE INVENTION

The preferred exemplary embodiment of the present invention includes an external analog built-in self-test (BIST) module for a test interface board, such as a load board on a test head, for testing devices such as integrated processors (IC). Analog BIST is from perspective of the test board or Tester and not the device under test. Built in self test, which is called a BIST is usually a reference for something that is internal to the DUT. But for this application, when I am building a test board, I mean that it is a BIST on the board and the board is doing the work instead of the tester. So from the tester point of view, it is a BIST on the load board, which is called the test board or the load board for production.

Figure 1:
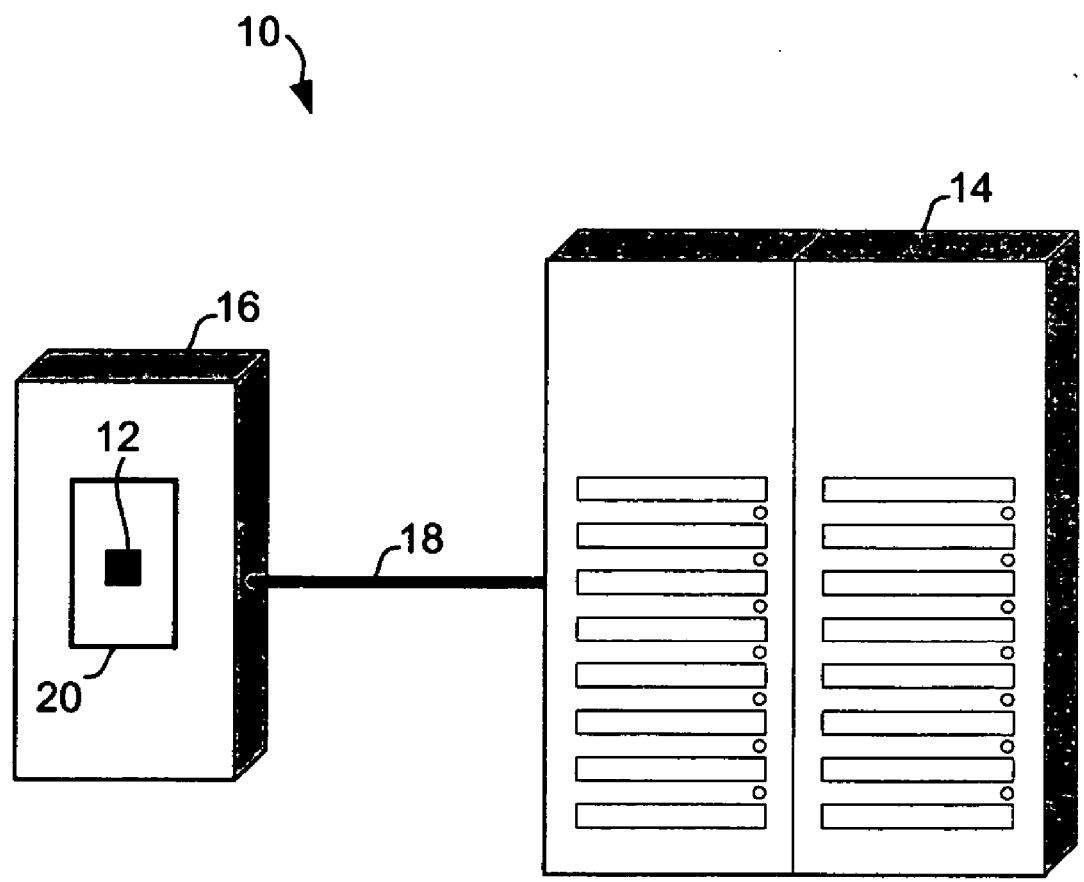
FIG. 1 illustrates a conventional electronic circuit test system.
Figure 2:
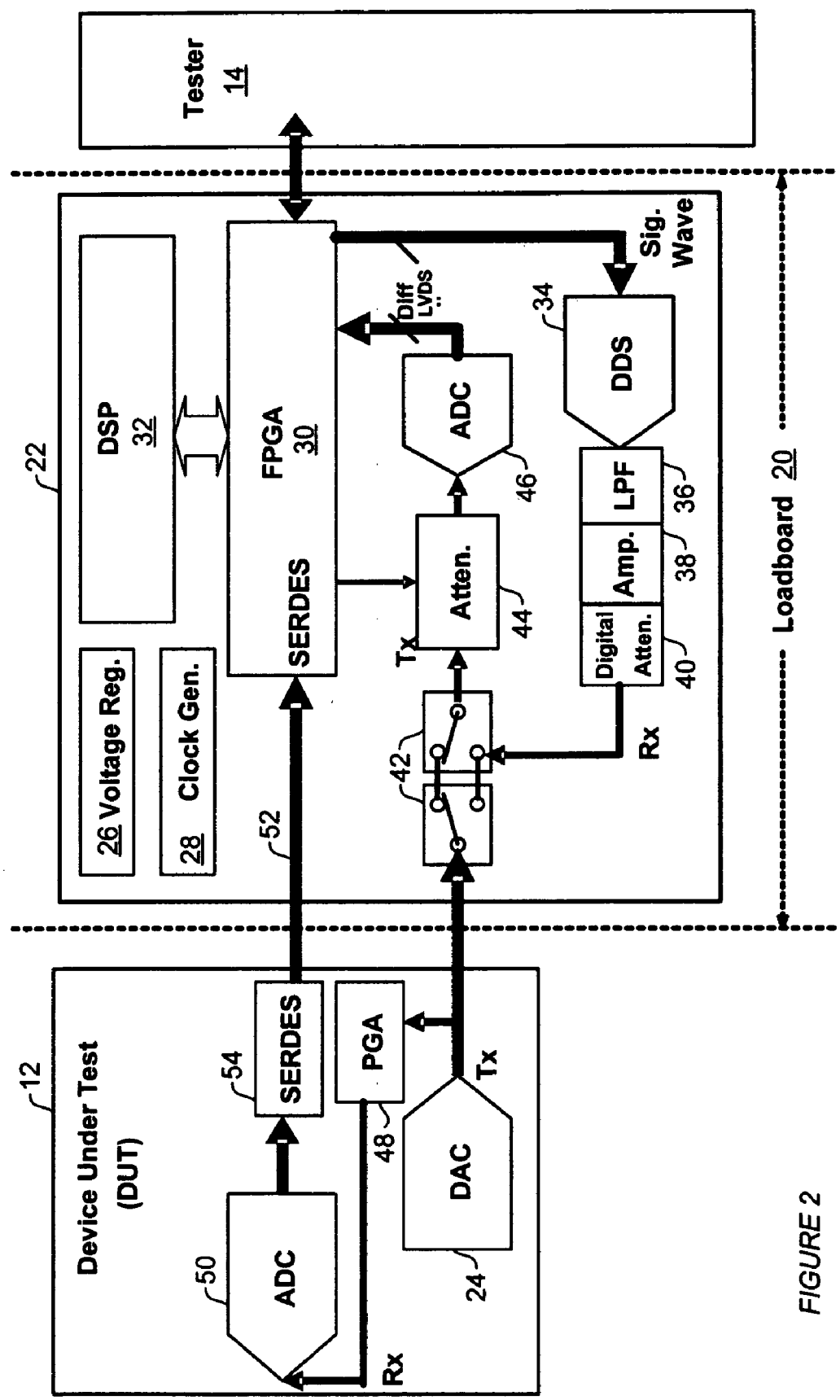
FIG. 2 illustrates analog BIST module and components of the preferred embodiment and interfaces with a DUT and tester.

FIG. 2 illustrates a block diagram of a preferred embodiment of an analog BIST module 22 and operative connections and divisions between the preferred module 22, a device under test (DUT) 12, and a tester 14 of a system for testing IC devices. The diagram shows division lines representing a load board 20 that is operably and may be physically connected to analog BIST module 22. Components of analog BIST module 22 include voltage regulators 26, which provide voltage sources for different levels of voltages required by the components of the load board 20, clock generator 28, field programmable gate array (FPGA) 30, digital signal processor (DSP) 32, a DDS (direct digital synthesizer) 34 that may optionally be a digital to analog converter (DAC), a Low Pass Filter (LPF) 36, Differential amplifier 38, digital attenuator 40, radio frequency (RF) relays 42, an analog attenuator and an analog-to-digital (ADC) converter 46.

FPGA 30 interfaces between DUT 12 and one or both of DSP 32 that is on-board module 22 and tester 14. In the preferred embodiment, instead of the conventional method of having tester 14 setup the tests, the test setup of the DUT 12 is performed by FPGA 30. FPGA 30 is the control interface for tester 14 to module 22 and controls DDS (or DAC) 34 in order generate analog test signals, such as sine wave or a multitone signal, for each test-mode in the testing of DUT 12. The test signals from DDS 34 are filtered through LPF 36, amplified through amplifier 38, and attenuated through digital attenuator 40 prior to reaching RF relays 42. RF relays 42 operably connect module 22 with DUT 12 in order to transmit high frequency test signals without changing the signals' characteristics, with minimal attenuation, and therefore minimal distortion to the signals to/from the DUT.

The receiver path in the DUT 12 receives the analog test signal from RF relays 42 into DUT architecture wherein DUT 12 performs test operations using internal design-for-test (DFT) or other circuitry and outputs test data as either an analog signal or a digital signal. Analog test signals are for example: amplified through programmable gain amplifier (PGA) 48. The analog signals can be converted to digital in ADC 50 for extraction from the DUT 12 through DFT architecture or any digital port capable of interface with a socket on load board 20. The resulting test data that is generated in the DUT 12 must be extracted and analyzed to determine if the DUT if functioning correctly. If the test data output is in digital format, then the analog data signals may be converted by the Functional ADC 50 or other test dedicated ADC inside the DUT using programmable gain amplifier (PGA) 48 prior to conversion by ADC 50.

All digital or analog test data signals generated in DUT 12 are transmitted out of the DUT 12 to FPGA 30. From the FPGA 30, test data signals are transmitted to either on-board DSP 32 or to tester 14 for analysis. Analog Data generated in DUT 12 is transmitted to FPGA 30 via RF relays 42 that switch the analog test data signals to digital converter ADC 46 after the signals are attenuated by attenuator 44. ADC 46 converts the analog signals to digital format prior to reception by FPGA 30. FPGA controls setup for relays 42 and ADC 46 for each test mode.

In FIG. 2, digital test data is transferred out of DUT 12 via at least one serialize/deserialize (SERDES) port 54 to a SERDES port in FPGA 30. If a DUT contains many ADCs it may be impossible to send all data signals out of the DUT in parallel and therefore must be performed serially, which may slow the communication rate. If a DUT contains multiple SERDES ports, the multiple ADCs can export data simultaneously through the serial ports. SERDES 54 serializes and deserializes data on the serial communication bus 52.

Figure 3:
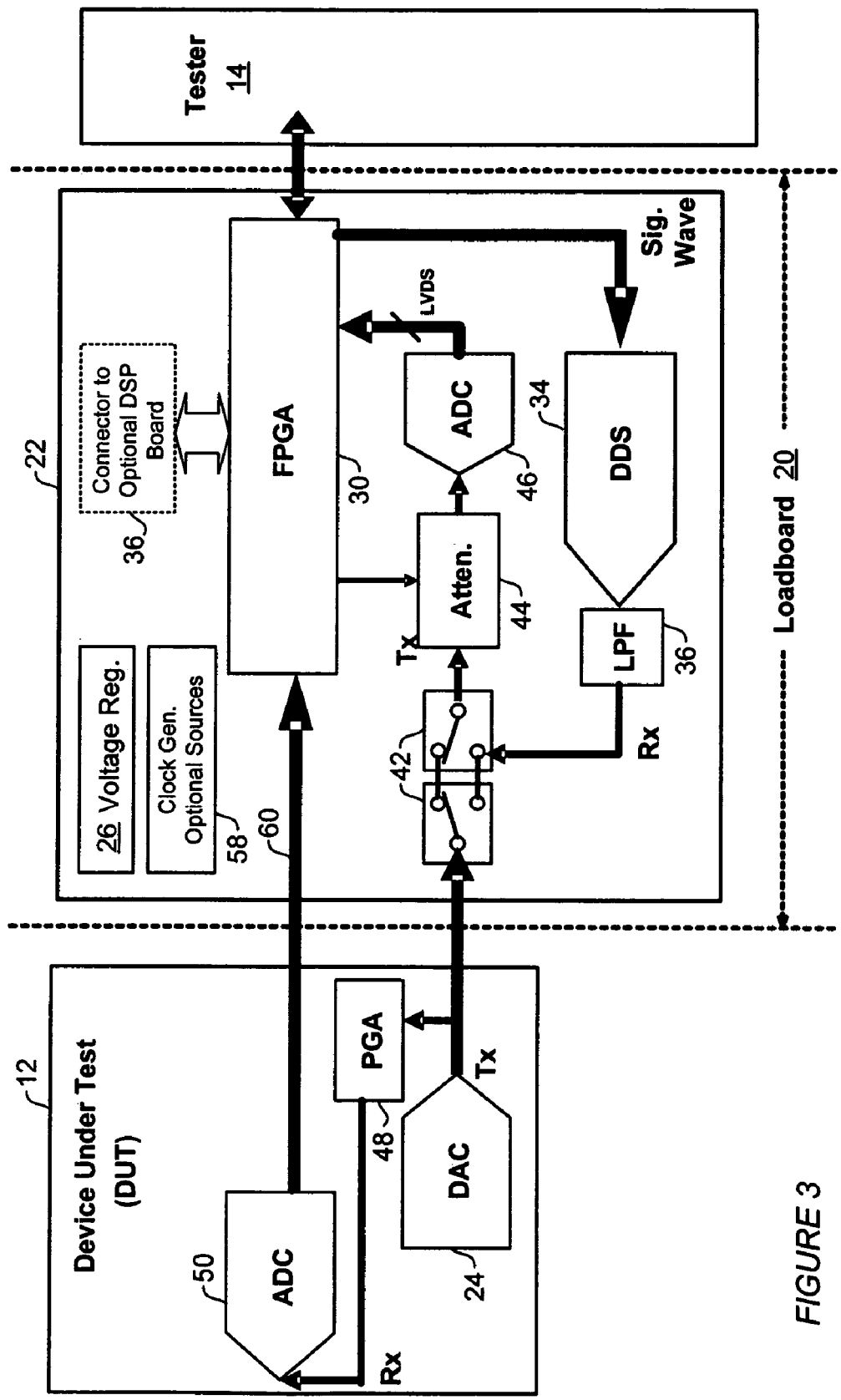
FIG. 3 illustrates the analog BIST module of an alternative embodiment.

An alternative embodiment for a digital communication channel between DUT 12 and FPGA 30 is via a parallel bus 60, shown in FIG. 3, connecting ADC 50 and FPGA 30. The method and path of data transfer out of DUT 12 depends upon the design of the DUT and the DFT architecture designed into a DUT. For example, if DUT 12 has a single ADC 50 converting data prior to transmitting to a parallel bus of ten bits through ten pins on the DUT 12, and the data is moving at a fast clock rate of, for example, 125 MHz then a parallel bus to FPGA 30 would be adequate. However, a DUT may be designed with multiple ADCs that would each require ten pins for each parallel bus causing the DUT to run out of data export pins.

Using a SERDES port 52, a parallel data structure can be converted into serial channels that are either dedicated for test or those that are functional, and in functional mode use the serial ports for test mode data extraction. A SERDES 52 can process a ten bit parallel bus from ADC 50, convert it to serial, and transmit the data over bus 52 to FPGA 30. In the present embodiments, choice of data bus does not affect DUT test results After test data is captured into FPGA 30 from DUT 12, analysis of test signals from may be performed by either tester 14 or preferably by DSP 32. In the alternative embodiment in FIG. 3, test data is analyzed by tester 14 and a socket connector 36 is added to module 22 for an optional DSP board. However, in a production venue, where millions of DUTs are tested, the total test time of each DUT is the primary consideration for test system design. Performing test analyses on-board the load board 32 using module 22 can save many seconds of test time per DUT over using tester 14, which results in millions of seconds of test time saved in the testing process. The choice of hardware used to analyze test data depends upon the quantity of data, resources and processing speeds required for processing, and complexity of the one or more DUTs requiring analysis. DSP 32 is the preferred method of processing because the processing speeds in DSP 32 can be chosen with faster processing speed and greater capacity than a processor in tester 14 in order to handle a greater quantity of data at a faster speed from multiple DUTs, or to use many DSPs on the Load board simultaneously. Further, the communication bus between DSP 12 and FPGA 30, that are on the same load board 20, is faster than between FPGA 30 and remotely-connected tester 14. Additionally, if the processing speed or capacity of DSP 32 needs to be upgraded, replacing it with a faster DSP or adding additional DSPs on additional test modules 22 is a simpler procedure and more cost-effective than upgrading tester 14.

Figure 4:
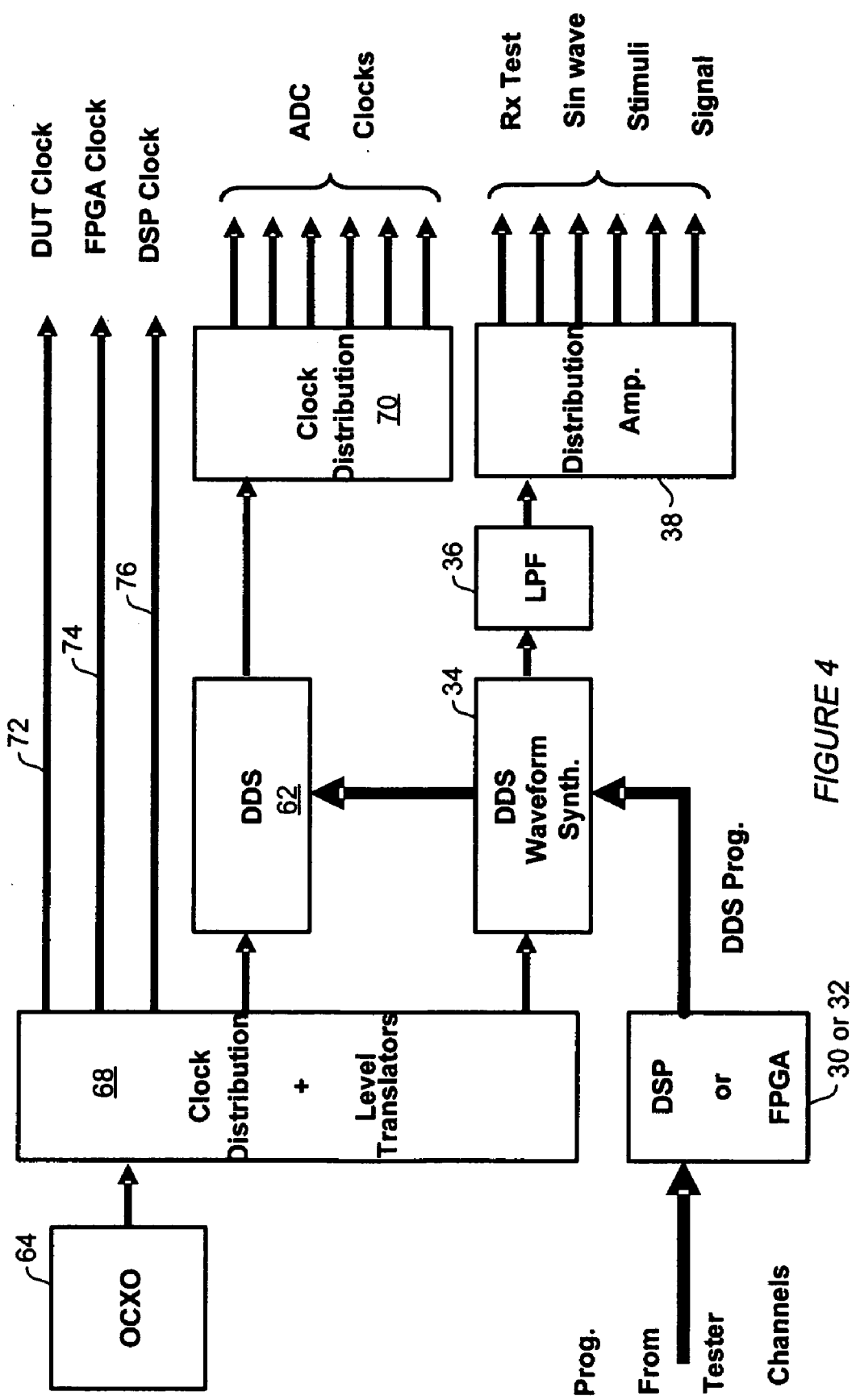
FIG. 4 illustrates the clock and analog stimuli distribution system of the preferred embodiment.

FIG. 4 illustrates an exemplary embodiment of clock generation 28 and clock distribution throughout test module 22. In the preferred embodiment, test module 22 can generate the operating clock, and then drive an analog signal, perform analog capture or measurement, and perform the test data analysis, which are the tasks conventionally performed by a tester, but with the required resolution and jitter (or phase noise). On analog BIST module 22 clock source 28 is preferably a high-resolution clock such as an OCXO (oven controlled crystal oscillator) clock 64. FPGA 30 controls clock generation programming for a second DDS 62 to produce an on-board clock signal for test module 22. OCXO 64 is operably connected to a clock distribution device 68, such as a LVPECL, that can simultaneously transmit clock signals to multiple circuitry in the module 22 and load board 20. Clock distribution 68 transmits a common clock signal to the DUT clock 72, DDS 62, FPGA clock 74, and DSP clock 76.

Clock distribution device 68 transmits a clock signal to a DDS 62 device that is further distributed as a clock 70 for all ADCs on module 22 that perform conversion of analog test data from DUT 12. Clock distribution 68 further drives a clock signal to DDS 34. When DSP 32 or FPGA 30 receives control signals from a tester channel, it programs DDS 34, which generates an analog test signal that passes LPF 36 and distribution Amplifiers 38. A test signal such as sine wave or other test stimuli signals transmit to the DUT 12. Although FIG. 4 shows two DDS devices on the module, an analog BIST module 22 could incorporate any number of DDS devices to perform these functions for multiple DUTs.

Figure 5:
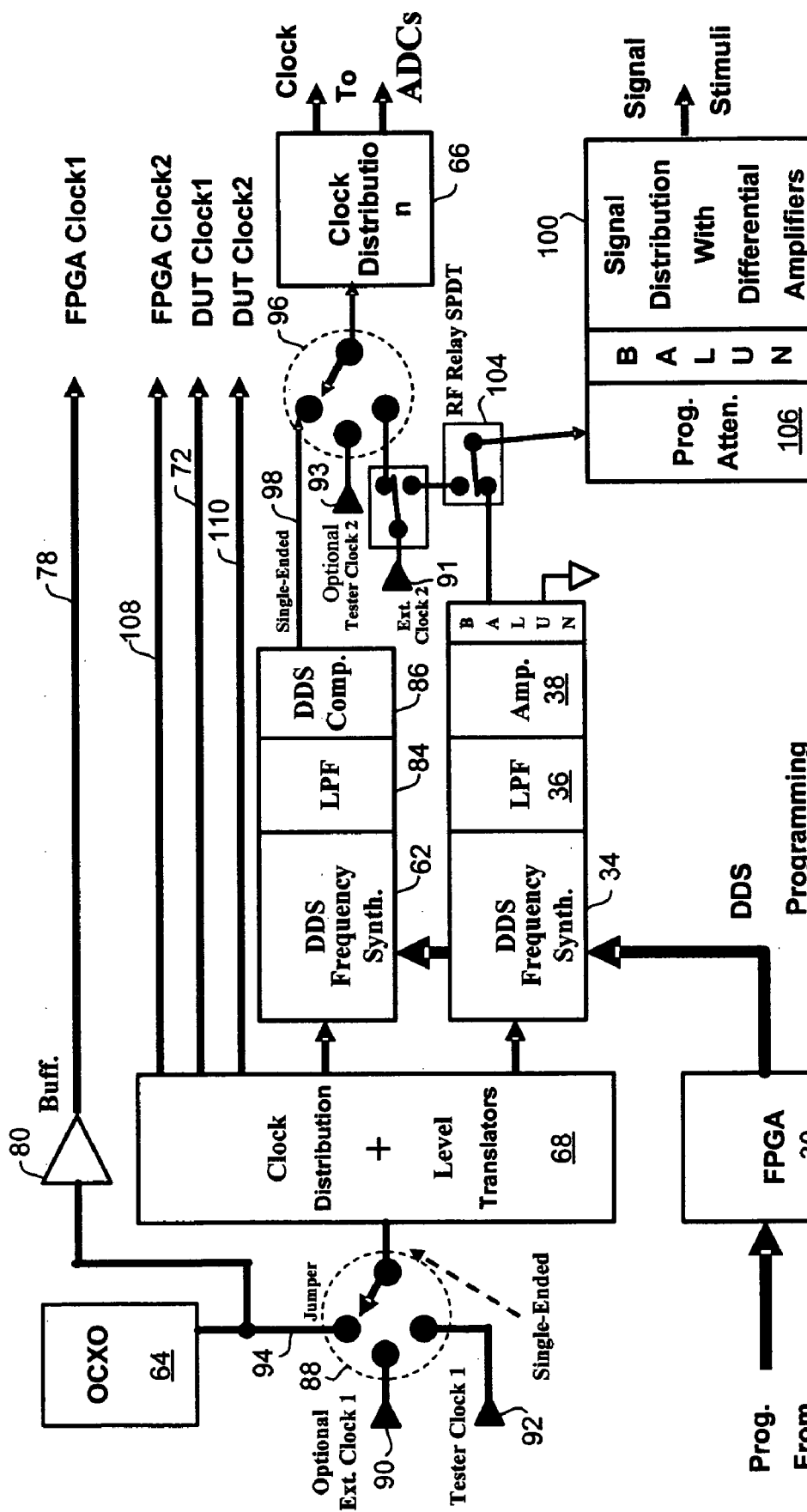
FIG. 5 illustrates an alternative clock and analog stimuli generation system.

FIG. 5 shows alternative embodiments for clock generation sources. Clock source 58 could be a clock driven from the test module 20, external sources, or the tester. A selector switch 88 is connected to module 22, either directly or operatively, that provides a selection to alternative clock sources. Switch 88 may be mechanical or electronic. Selections for a clock source include the OXCO clock 64, an external clock 90, or a clock from tester resources 92. Since the clock generation may be selected from one of multiple sources, there are multiple clock channels to the FPGA 30. If the load board clock is driven b y the OXCO 64, the clock channel communicates through buffer 80 as FPGA clock signal 78. If an external clock is selected on switch 88, then clock distribution 68 drives a second clock channel 108 to FPGA 30. Thus the FPGA always has a clock source from the OCXO to Program the External sources. DUT 12 may receive several clock signal from distribution 68 as required by the DUT.

In the alternative embodiment, a second selector or jumper switch 96 is also provided to select, for distribution 70 the clock source generation to the ADCs. Switch 96 may connect either an on board clock source channel 98 from DDS 62, which is the first priority for a clock source for load board 20, external clock 90, or a clock from the tester 92. Clock sources chosen from switch 88 and switch 96 select External sources, then these Instruments must be synchronized. Both switches 96 and 88 must be switched to drive the module 22 simultaneously from the board clock 64, from tester 92, 93, or both from external clock 90, 91. Since the clock is a problematic function on the load board 20, the present invention provides a free running clock from the OCXO or from the External sources (e.g., Signal Generator).

FIG. 5 further shows programmable attenuator 106 connected to signal distribution with differential amplifiers 100. The channels for signal distribution 100 depends on how many DUTs or channels are under test. For example, if the DUT has 32 channels and the Load-board designed for Dual-Site testing (2 devices simultaneously), then the DUTs 12 has sixty-four channels to test.

Figure 6:
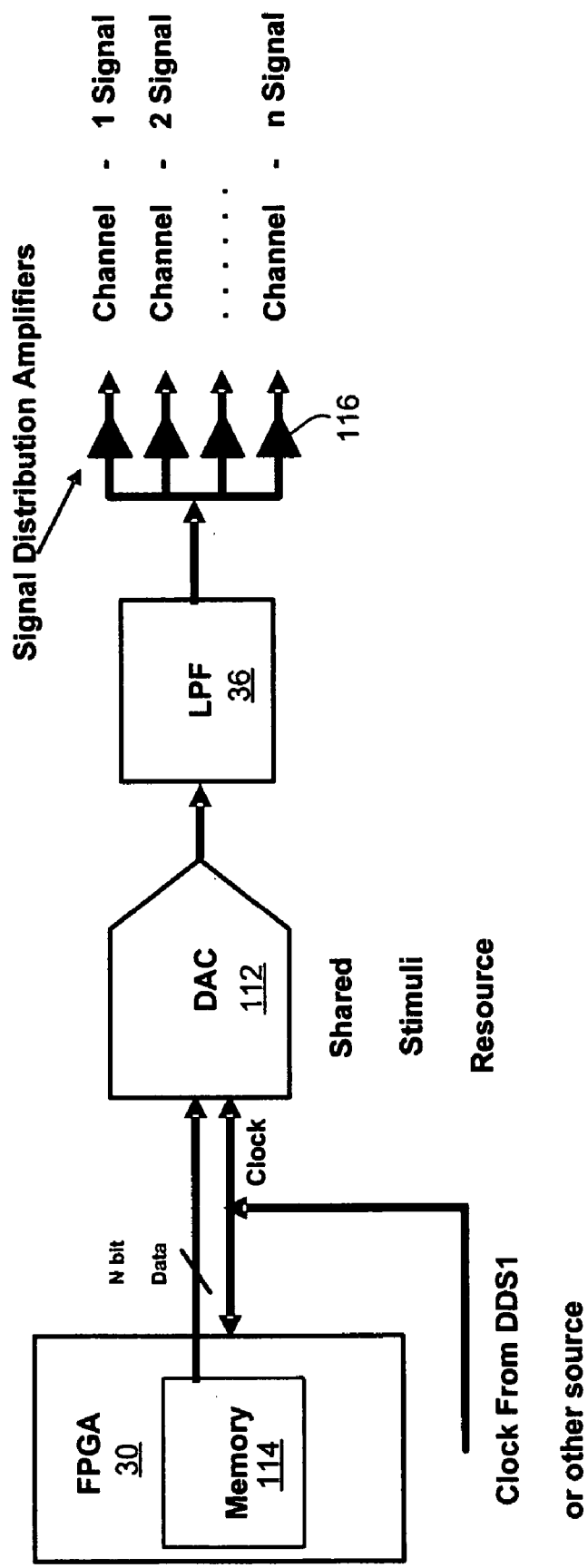
FIG. 6 illustrates alternative BIST module circuitry for transmitting analog test signals to the DUT channels.

FIG. 6 illustrates an alternative embodiment of an Analog Stimuli in the test module circuitry to transmit analog test signals to DUT 12. Instead of DDS 34, the module uses DAC 112 that receives digital signals for any waveform from FPGA memory 114. The analog signals are transmitted to DUT 12 through LPF 36 to signal distribution amplifiers 116 for multiple channels in DUT 12.

As stated above, relays 42 are only embodiments that represent various relay designs for test module 22. Relay requirements between various test module 22 components and DUT 12 are illustrated in the relay logic diagram in FIG. 7. The first relay test path requirement 118 is used for DUT open/short test between the calibration reference source or tester 14 channel and DUT 12, The second relay test path requirement 120 is between the same calibration source and ADC 46. The third relay test path requirement 122 is the DDS 34 or DAC 112 calibration or for board Self-Test using program stimuli between DAC 11 2/DDS 34 and ADC 46. The fourth calibration requirement 124 is a DUT 12 receiver reception test that tests the DUT 12 response to program stimuli from DAC 11 2/DDS 34. The fifth relay test path requirement 126 is a DUT transmitter/driver test for sending analog test data out of the DUT 12 to ADC 46.

Figure 7:
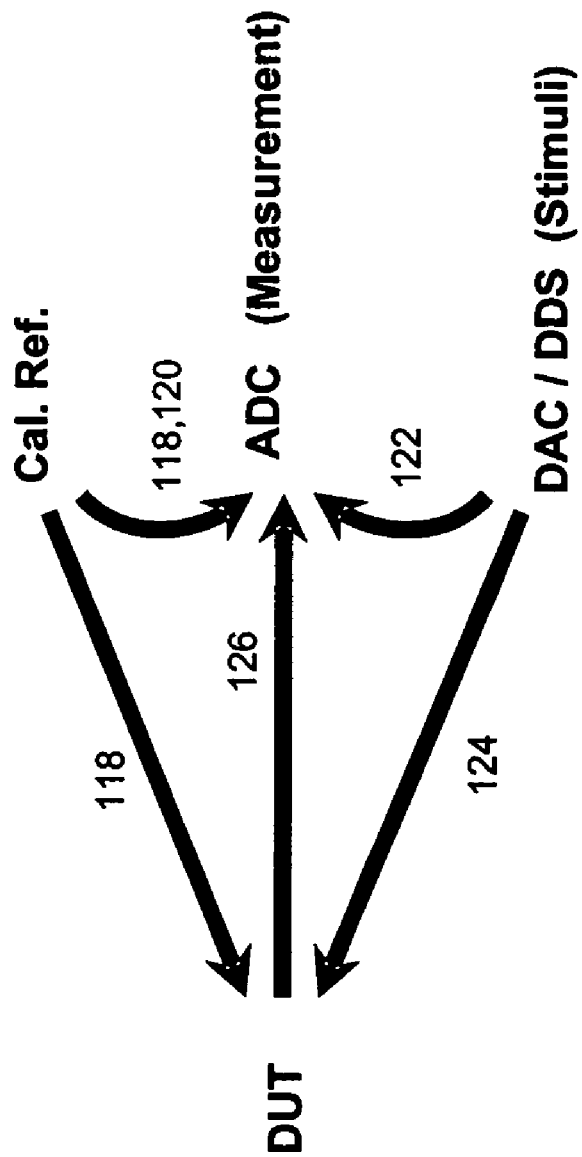
FIG. 7 illustrates relay requirements of the analog BIST module.
Figure 8:
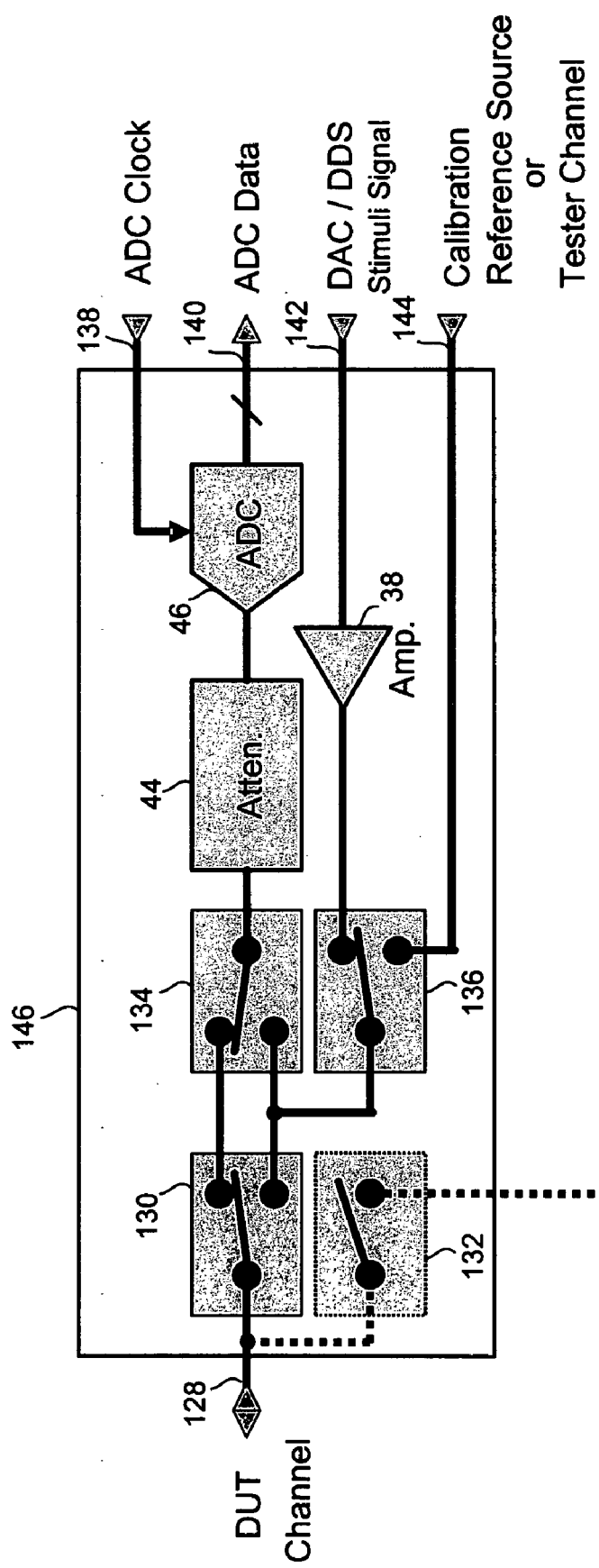
FIG. 8 illustrates a basic building block of relays and circuitry of the analog BIST module.

In the analog BIST module 22, a basic building block of analog circuitry is illustrated in FIG. 8 that follows the logic flow of relay requirements in FIG. 7. Circuit block 146 contains the analog connections between test module components and DUT channel 162 through a set of relays. The calibration reference source or tester channel 144 used for calibration connects to ADC 46 through relays 136 and 134 and attenuator 44 and connects to DUT channel 128 through relays 136 and 130. The channel for program stimuli signals from DAC 112/DDS 34 connects through amplifier 38 to DUT channel 128 by switching through relays 136 and 130. For calibration of DAC 112/DDS 34 the relays 136 and 134 switch to connect ADC 46. Test data is sent through DUT channel 128 through relays 130 and 134 through ADC 46 to channel 140 where it is received by FPGA 30. ADC clock line 138 connects to ADC 46 from clock distribution 70. Relay 132 is an optional relay used for loop-back tests for data handled in DUT channel 128.

Figure 9:
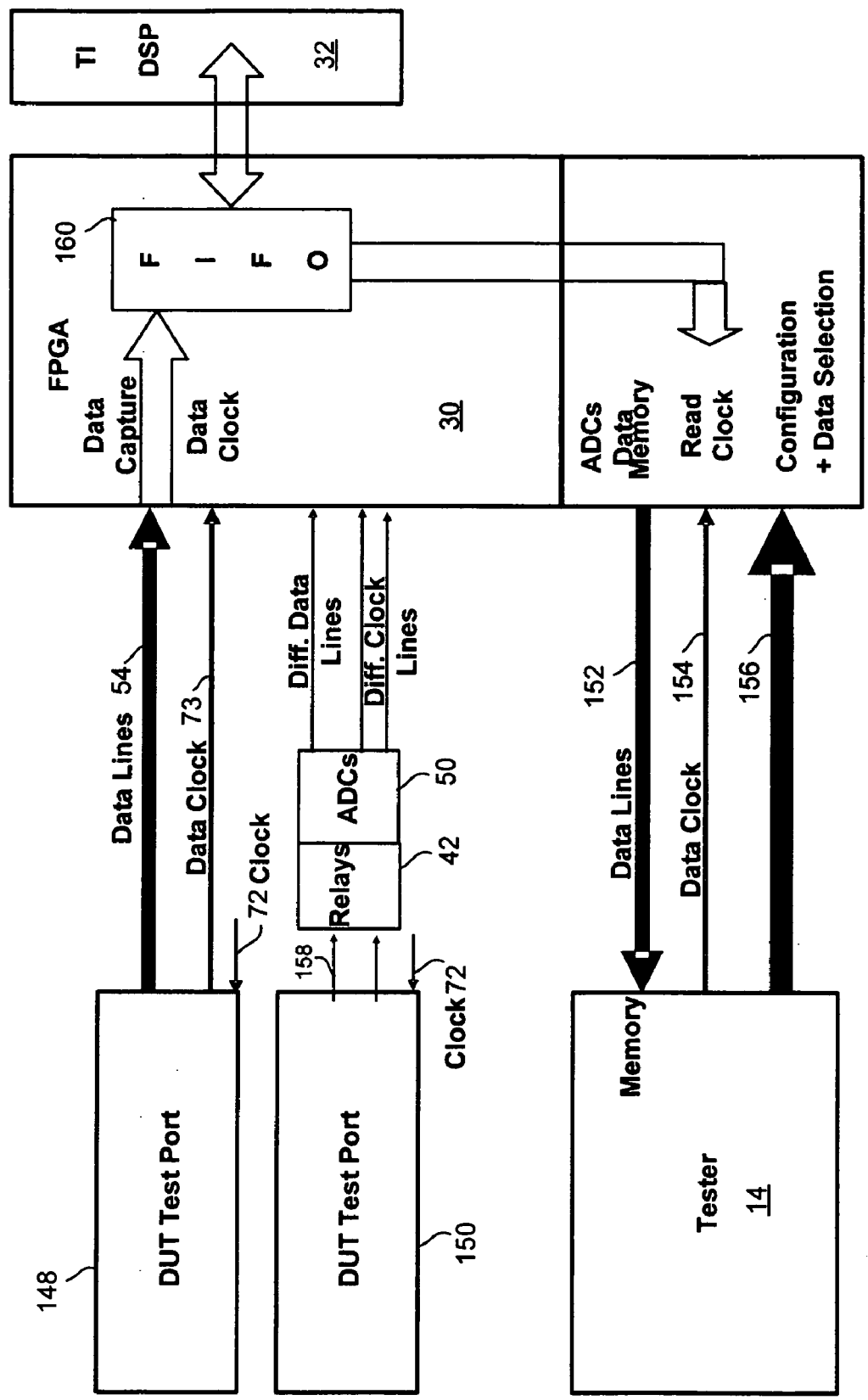
FIG. 9 illustrates how data is transferred from a DUT to the analog BIST module for analysis.

FIG. 9 shows a block diagram illustrating exemplary hardware that can be used for test data measurement and data capture from DUT 12. After test data has been generated by DUT 12, the digital data is transmitted to a digital I/O test port 148 and analog data is transmitted to analog I/O test port 150. Although only two test ports are shown in the figure, it is understood that a typical DUT may have numerous I/O ports for digital or analog test data. Test port 148 has one or more data communication lines 54, which may be either serial or parallel to transmit data to FPGA 30 according to data clock 73. If analog test data is generated in DUT 12, then the data is transmitted through test port 150 over channel 158. FIG. 9 further shows ADC 50 connected to the FPGA 30 in order to capture data to the FPGA. As described previously, the analog data is sent over relays 42 through ADC 50, where the analog data is converted to digital, prior to the data being captured by FPGA 30. Data transfer is performed according to data clock 72. In order to compensate for a potential difference in clocks between FPGA 30 and tester clock 154 and/or a clock for DSP 32, all test data may feed into a FIFO (First In First Out) buffer 160 such as a dual-port asynchronous FIFO, or any equivalent type of buffer or data storage device, prior to the data being transferred to tester 14 or DSP 32. Since data on-board the module 22 is typically clocked to on-board DDS 62, a sample clock is provided in the FPGA so that any external device can remove the test data without synchronizing to the module clock 28. For example, FIFO 30 receives a read clock 154 from the tester 14 in order to read output data from FIFO 160. Data transfer from FPGA to Tester 14 over data lines 152. As stated previously, tester 14 can transmit instructions to the FPGA 30 over communication line 156 for configuration of the load board 20, analog BIST test module 22, and data selection for testing the DUT 12. However, data captured in FIFO 160 is preferably analyzed by on-board DSP 32 for faster analysis.

Figure 10:
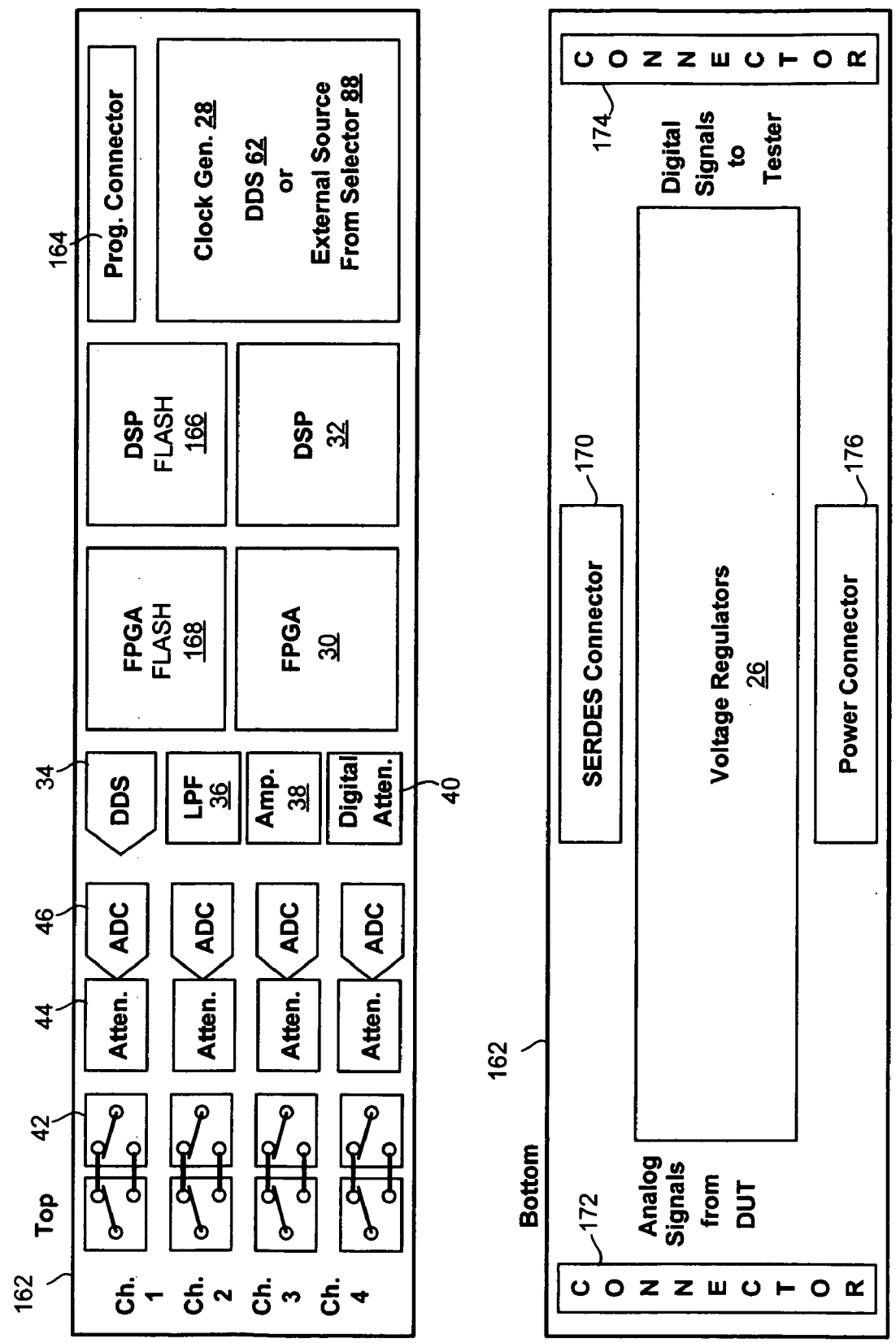
FIG. 10 illustrates an exemplary implementation of the analog BIST module board.

Referring to FIG. 10, an exemplary implementation of a four-channel analog BIST module board 162. The "top" view of the module board 162 shows four channels of RF relays, where each channel includes a similar configuration of RF relays 42, ADC 46 with attenuator 44. Common devices to all channels include the DDS 34 (or DAC depending on configuration), LPF 36, amplifier 38 and digital attenuator 40 for transmitting analog test signals to a DUT. Also included in the exemplary implementation is an FPGA flash memory 168 for FPGA 30 and DSP flash memory 166 for DSP 32. Clock generation 28 can either be driven by DDS 62 or alternate sources from switch 88. A programming connector 164 allows programming the FLASH devices of the module board 162 from an external programming device. The "bottom view" of the test module board 162 shows voltage regulators 26, SERDES connector 170 for sending and receiving test data over a serial channel from DUT 12, power connector 146 for supplying power to module components, and a first connector 172 for receiving analog signals from DUT 12 and a second connector 174 for transmitting digital test signals between FPGA 30 to tester 14.

Figure 11:
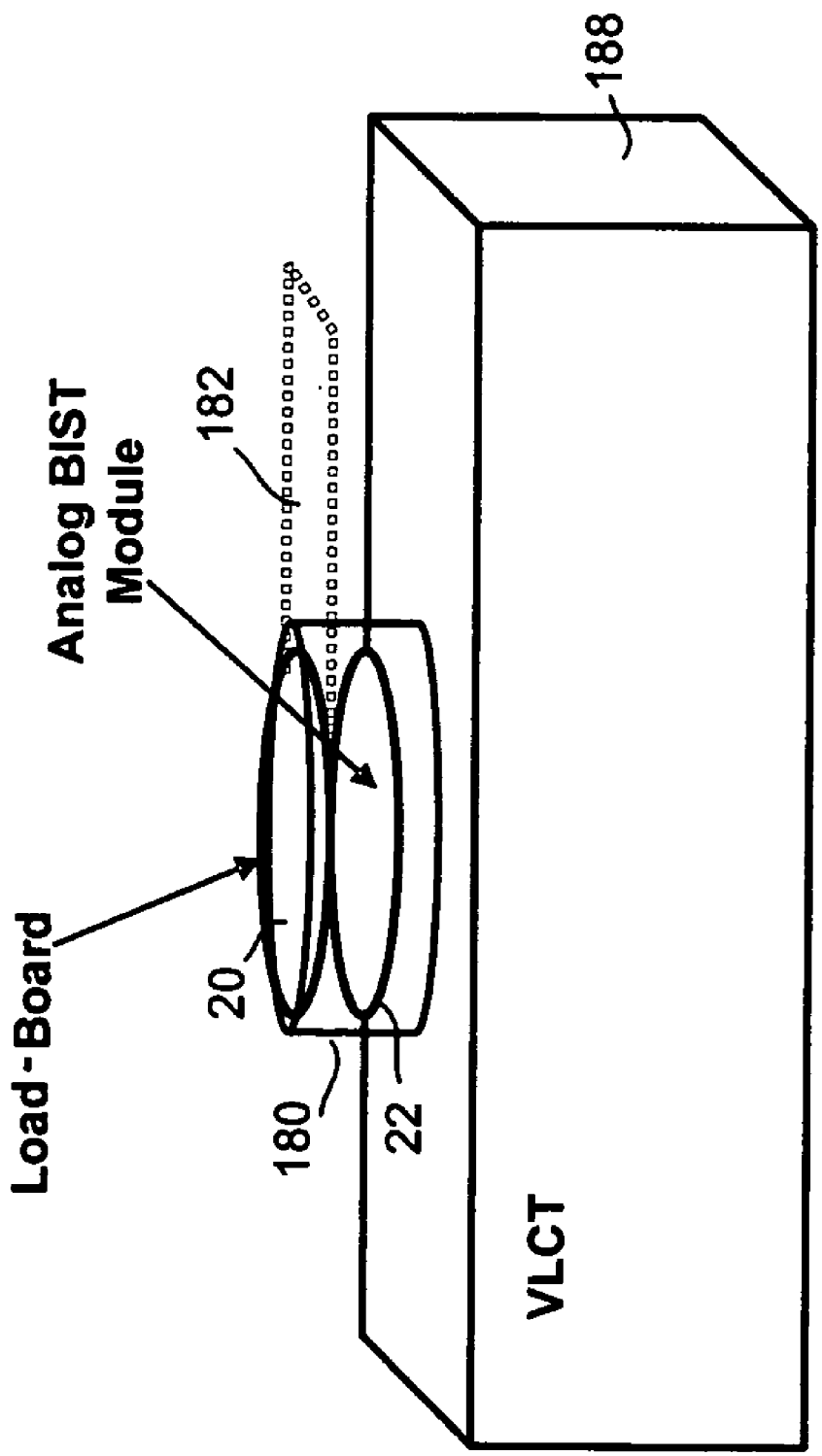
FIG. 11 illustrates an exemplary implementation of the analog BIST module with a VLCT.

FIG. 11 illustrates an exemplary configuration of analog BIST test module 22 with load board 20 on a very low cost tester (VLCT) 178 that has a RASP interface 180. Test module 22 may be placed within the RASP 180, connected to the load board 22, or alternatively placed on the load board 22. Alternatively, the analog BIST module 22 could connect to a load board extension 182 (shown as dashed lines) outside of the RASP 180. The use of extension 182 can provide multiple analog BIST modules 22 for increased testing capacity of multiple DUTs. Several modules can be prepared to easily replace any module that becomes damaged or has an error caused by a malfunction.

One skilled in the art will appreciate that the present invention can be practiced by other than the described embodiments, which are presented for purposes of illustration and not limitation, and the present invention is limited only by the claims that follow.

What is claimed is:

1. An apparatus for testing of a device-under-test (DUT), comprising:
    a test module, operably connected to a test head in the test system, including:
        a field programmable gate array (FPGA) that performs test setup of the device-under-test (DUT) and other components in the test module;
        a clock device that distributes a common clock signal to the components operably connected to the test module;
        a first direct digital synthesizer (DDS) to synthesize analog test signals controlled by the FPGA prior to transmitting the analog test signals to the DUT;
        a second direct digital synthesizer (DDS) to generate a high resolution clock signal controlled by the FPGA in order to clock the ADC for digitizing the tested analog signals from the DUT; and
        an analog-to-digital converter (ADC) to convert analog test data from the DUT to digital test data prior to transmission of the converted analog test data to the FPGA; and
    a load board, which operably connects the test module to the test head, for programming the test module to transmit and receive analog test signals to and from the DUT.

2. The apparatus of claim 1, wherein the FPGA programs the first DDS and the second DDS to generate and transmit analog test signals to the DUT, captures digital test data from the DUT, and transmits the captured digital test data from the DUT to DSP processor for analysis.

3. The apparatus of claim 1, further comprising:
    a low pass filter, operably connected to the direct digital synthesizer (DDS);
    an amplifier, operably connected to the Low Pass Filter (LPF); and
    a digital attenuator, operably connected to the amplifier,
    wherein the analog test data signals from the first DDS are filtered by the LPF, attenuated by the attenuator, and amplified by the amplifier prior to transmission of the analog test data signals to the DUT.

4. The apparatus of claim 3, wherein the FPGA is controlled by a test program from a tester in the test system.

5. The apparatus of claim 1, wherein the DAC is a digital-to-analog converter that converts digital test signals from the FPGA to analog prior to transmission to the DUT.

6. The apparatus of claim 1, wherein the clock source device (such as an OCXO) distributes clock signals to clocked components on the test module through a clock distribution devices (such as using LVPECL technology).

7. The apparatus of claim 6, further comprising:
    a second direct digital synthesizer, operably connected to the clock distribution device, to drive a clock signal from the clock distribution device to the ADC.

8. The device of claim 1, wherein the clock source is chosen from one of an clock generator on-board the module, an external clock source, and a clock from a tester connected to the test system, and
    wherein the FPGA transmits the digital test data to a tester in the test system for analysis of the digital test data.

9. A test system for testing of a device-under-test (DUT), comprising:
    a tester with a test head;
    a load board, operably connected to the test head and a socket that receives a device-under-test (DUT); and
    a test module, operably connected to the load board, including:
        a field programmable gate array (FPGA) that performs test setup of the device-under-test (DUT) and other components in the test module;
        a clock source and clock distribution device that distributes a common clock signal to the components of the module;
        a direct digital synthesizer (DDS) to synthesize analog test signals controlled by the FPGA prior to transmitting the analog test signals to the DUT; and
        an analog-to-digital converter (ADC) to convert analog test data from the DUT to digital test data prior to transmission of the converted analog test data to the FPGA.

10. The test system of claim 9, wherein the test module captures and analyzes test data received from the DUT.

11. The test system of claim 9, wherein the FPGA programs the DDSs to generates and transmits analog test signals to the DUT and clock to the ADC in order to capture analog test data from the DUT, and transmits the converted digital test data from the DUT to DSP processor for analysis.

12. The test system of claim 9, further comprising:
    a low pass filter, operably connected to the direct digital synthesizer (DDS);
    an amplifier, operably connected to the Low Pass Filter (LPF); and
    a digital attenuator, operably connected to the amplifier,
    wherein the analog test data signals from the DDS are filtered by the LPF, attenuated by the attenuator, and amplified by the amplifier prior to transmission of the analog test data signals to the DUT.

13. The test system of claim 12, further comprising:
    a second direct digital synthesizer (DDS), operably connected to a second clock distribution device, to drive a clock signal to the ADC.

14. The test system of claim 9, wherein the DAC is a digital-to-analog converter that converts digital test signals from the FPGA to analog prior to transmission to the DUT, and
 wherein the clock device distributes clock signals to clocked components on the module through a clock distribution device.

15. A method for testing a device-under-test (DUT), comprising:
 providing a tester, test head, and load board operably connected as a test system; and
 transmitting analog test programs to the DUT using a test module that is operably connected to the load board, wherein the transmitting comprises generating, by the FPGA, analog test signals to the DUT, capturing digital test data from the DUT, and transmitting the captured digital test data from the DUT to a DSP processor on the test module for analysis.

16. The method of claim 15, further comprising:
 performing test setup of the device-under-test (DUT) using a field programmable gate array (FPGA) on the test module;
 distributing a common clock signal to the components operably connected to the test module using a clock source device;
 synthesizing analog test signals controlled by the FPGA prior to transmitting the analog test signals to the DUT using a direct digital synthesizer; and
 converting analog test data from the DUT to digital test data prior to transmission of the converted analog test data to the FPGA using analog-to-digital converter.

* * * * *